United States Patent
Hall

(10) Patent No.: US 7,863,894 B2
(45) Date of Patent: Jan. 4, 2011

(54) SMALL OPTICS CELL FOR MINIATURE NUCLEAR MAGNETIC RESONANCE GYROSCOPE

(75) Inventor: David B. Hall, La Crescenta, CA (US)

(73) Assignee: Northrop Grumman Guidance and Electronic Co., Inc, Los Angeles, CA (US)

( * ) Notice: Subject to any disclaimer, the term of this patent is extended or adjusted under 35 U.S.C. 154(b) by 278 days.

(21) Appl. No.: 12/313,230

(22) Filed: Nov. 17, 2008

(65) Prior Publication Data

US 2010/0123459 A1    May 20, 2010

(51) Int. Cl.
*G01V 3/00*    (2006.01)

(52) U.S. Cl. .................................... 324/307; 324/309

(58) Field of Classification Search .......... 324/300–322
See application file for complete search history.

(56) References Cited

U.S. PATENT DOCUMENTS

| | | | | |
|---|---|---|---|---|
| 4,147,974 A | * | 4/1979 | Greenwood | 324/304 |
| 4,157,495 A | * | 6/1979 | Grover et al. | 324/302 |
| 4,403,190 A | * | 9/1983 | Greenwood | 324/304 |
| 4,406,986 A | * | 9/1983 | Greenwood | 324/304 |
| 7,184,148 B2 | * | 2/2007 | Alphonse | 356/479 |
| 7,327,463 B2 | * | 2/2008 | Alphonse | 356/479 |
| 7,474,408 B2 | * | 1/2009 | Alphonse | 356/479 |
| 7,521,928 B2 | * | 4/2009 | Romalis et al. | 324/304 |

* cited by examiner

*Primary Examiner*—Melissa J Koval
*Assistant Examiner*—Dixomara Vargas
(74) *Attorney, Agent, or Firm*—Lynn & Lynn

(57) ABSTRACT

A beamsplitter is arranged to split an incident laser beam into a pump beam and a detection beam. The pump beam passes through the beam splitter and then reflects from a pair of mirrors to a quarter waveplate into an NMR cell. After passing through the NMR cell, the pump beam reflects from a mirror to a first photodetector. The detection beam reflects from the beam splitter and propagates on a path perpendicular to the path of the pump beam through the NMR cell. After passing through the NMR cell, the detection beam is incident upon a polarizer. The polarized portion of the detection beam then is incident upon a photodetector. Electrical signals output from the first and second photodetectors may then be processed to determine the rotation rate of the NMR cell about a sensing axis.

10 Claims, 2 Drawing Sheets

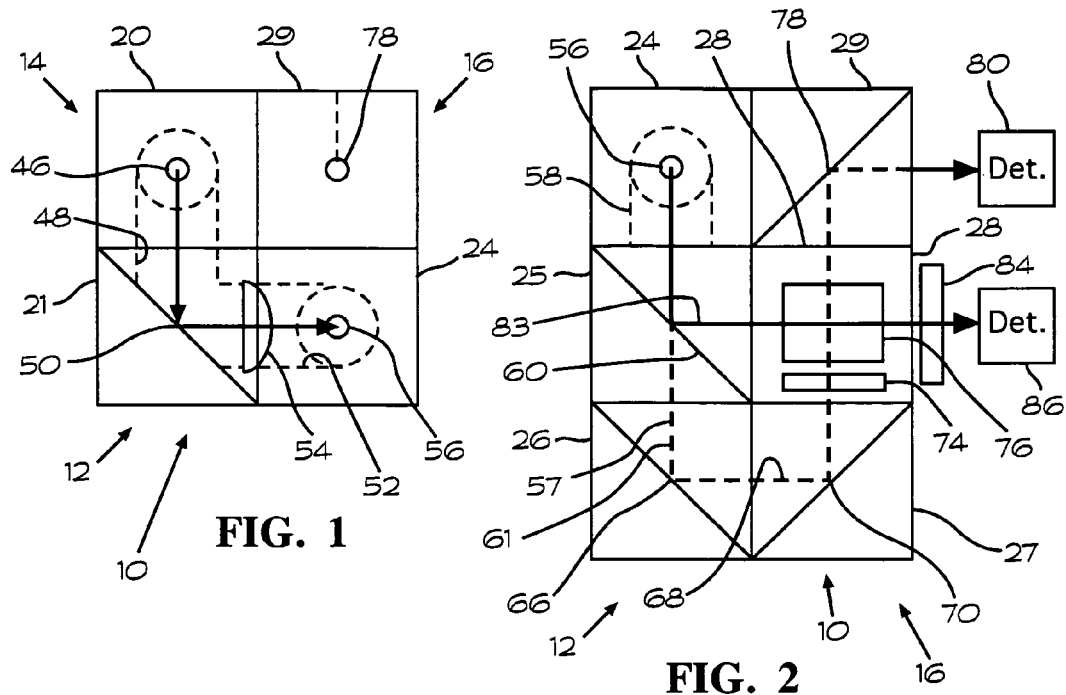
FIG. 1
FIG. 2
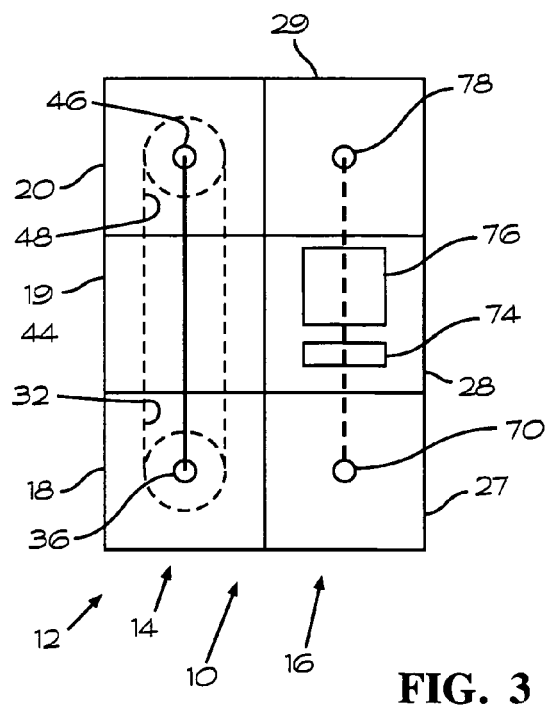
FIG. 3

SMALL OPTICS CELL FOR MINIATURE NUCLEAR MAGNETIC RESONANCE GYROSCOPE

BACKGROUND OF THE INVENTION

This invention relates generally to rotation sensors and particularly to the use of nuclear magnetic resonance (NMR) in rotation sensors. Still more particularly, this invention relates to an optics assembly that may be included in a miniature nuclear magnetic resonance gyroscope.

An NMR gyroscope uses optically pumped alkali atoms both to achieve macroscopic nuclear moments in the noble gas nuclei used as the rotation sensors and also to achieve a means of detecting those noble gas moments. In the NMR gyroscope, the spin moment of the Zeeman levels of the alkali are transferred via collisions to the nuclei of noble gas atoms. The subsequent precession of these moments about an applied magnetic field is observed by their effect on the alkali atoms and detected as modulation of a light beam. By comparing the precession frequencies of two noble gas systems, desired rotation effects can be extracted. The basic operation of the NMR gyroscope is described in U.S. Pat. No. 4,157,495 (Grover, Kanegsberg, Mark, Meyer). The disclosure of U.S. Pat. No. 4,157,495 is incorporated by reference into the present disclosure.

SUMMARY OF THE INVENTION

A small optics cell for a miniature NMR gyroscope includes a beamsplitter arranged to split an incident laser beam into a pump beam and a detection beam. The pump beam passes through the beam splitter and then reflects from a pair of mirrors to a quarter waveplate into an NMR cell. After passing through the NMR cell, the pump beam reflects from a mirror to a first photodetector. The detection beam reflects from the beam splitter and propagates on a path perpendicular to the path of the pump beam to the NMR cell. After passing through the NMR cell, the detection beam is incident upon a polarizer. The polarized portion of the detection beam then is incident upon a photodetector. Electrical signals output from the first and second photodetectors may then be processed to determine the rotation rate of the NMR cell about its sensing axis.

A method according to the present invention for forming an optics cell for a miniature nuclear magnetic resonance (NMR) gyroscope comprises the steps of arranging an optical signal source to provide an optical signal and arranging a beamsplitter to split the optical signal into a pump beam that passes through the beamsplitter in a pump beam optical path and a detection beam that is reflected by the beamsplitter in a detection beam optical path. The method also includes the steps of arranging a quarter wave plate such that the pump beam is incident thereon; and arranging a pair of mirrors arranged to direct the pump beam so that the pump beam and the detection beam optical paths intersect in an NMR cell region after the pump beam has propagated through the quarter wave plate. The method further includes the steps of arranging a first photodetector to detect the pump beam after the pump beam has exited the NMR cell region, arranging a detector polarizer such that the detection beam is incident thereon after the detection beam has exited the NMR cell region and arranging a second photodetector to detect the detection beam after it propagates through the detector polarizer.

The method of the present invention preferably further comprises the steps of forming the beamsplitter as a polarizing beamsplitter, arranging a source quarter wave plate and a source polarizer arranged such that the optical signal passes through the source quarter wave plate and the source polarizer before impinging upon the polarizing beamsplitter, and arranging the source polarizer and the polarizing beamsplitter such that the pump beam passing through the NMR cell region is circularly polarized and the detection beam passing through the NMR cell is linearly polarized.

The method according to the present invention may also further comprise the steps of forming the polarizing beamsplitter to have a variable split ratio between the pump beam and the detection beam, and forming the source polarizer and the detector polarizer to have adjustable polarizer angles.

BRIEF DESCRIPTION OF THE DRAWINGS

FIG. 1 is a top plan view of an optics cell according to the present invention;

FIG. 2 is a right side elevation view of the invention;

FIG. 3 is a front elevation view of an optics cell according to the present invention;

DETAILED DESCRIPTION OF THE INVENTION

Figure 4:
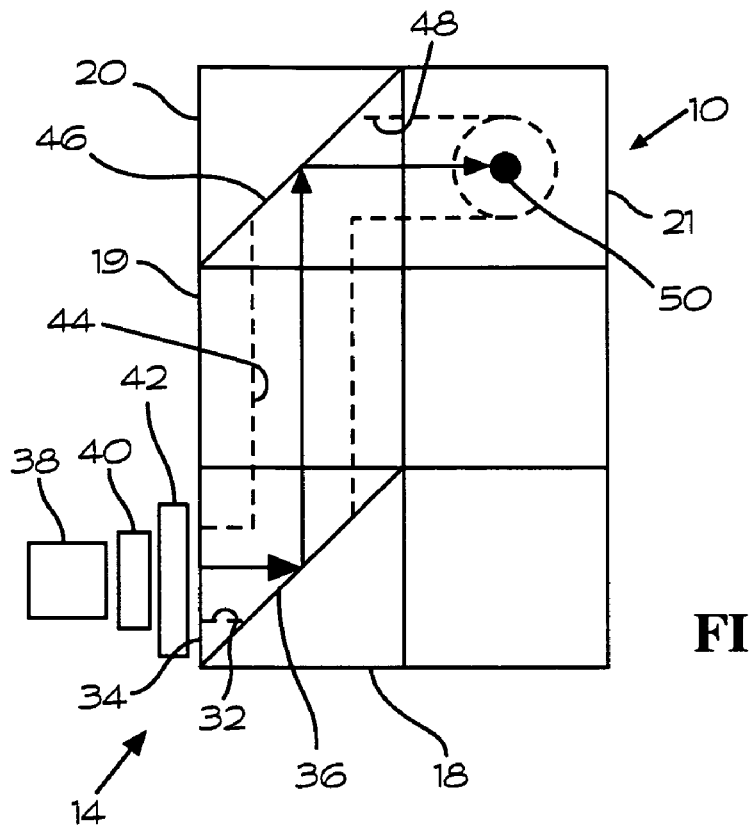
FIG. 4 is left side elevation view of an optics cell according to the present invention.

As shown in FIGS. 1-5, an optics assembly 10 includes a frame 12 that may be formed of glass or a similar material. The frame 12 preferably includes a pair of main sections 14 and 16. The main section 14 may include a plurality of blocks 18-21, and the main section 16 may include a plurality of blocks 24-29 that may be formed of glass or other similar substance. The two main sections 14 and 16 preferably are arranged to be adjacent to one another. For purposes of visualizing the invention, the blocks 18-21 and 24-29 may be regarded as having cubical configurations without limiting the scope of the invention.

Referring to FIG. 4, block 18 in main section 14 includes a passage 32 extending from an outer surface 34 to a mirror 36 inside block 18. As shown in FIG. 4, an optical signal source 38 is arranged to be near the surface 34 of block 18. The optical signal source 38 preferably is a vertical cavity surface-emitting laser (VCSEL), which is well known in the art and commercially available. The optical signal output from optical signal source 38 passes through a first quarter waveplate 40 and a polarizer 42 before entering passage 32. The optical signal propagates to mirror 36, which is arranged to reflect the optical signal through a 90° angle into a passage 44 that extends through block 19 into block 20. A mirror 46 inside block 20 reflects the optical signal through a passage 48 that extends from mirror 46 in block 20 to a mirror 50 in block 21.

Figure 5:
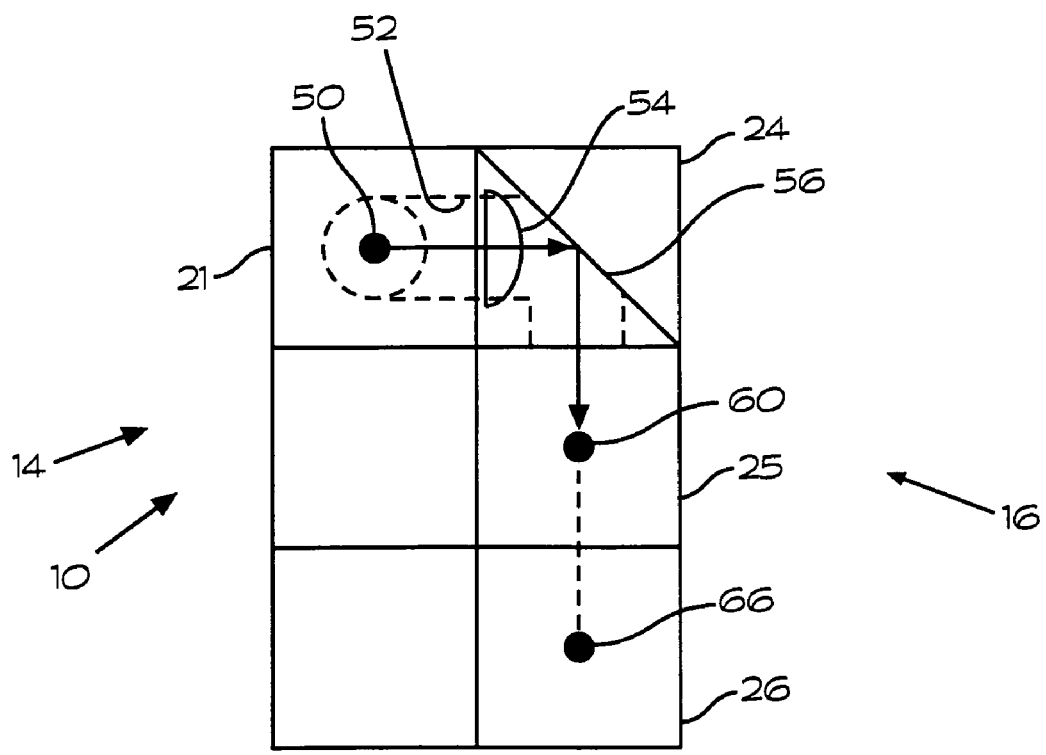
FIG. 5 is a rear elevation view of an optics cell according to the present invention.

Referring to FIGS. 4 and 5, the mirror 50 reflects the source light through a passage 52 in the block 21 into the block 24 where the source light propagates from the first main section 14 into the second main section 16. The source light next propagates through a collimating lens 54 to a mirror 56 in the block 24. The mirror 56 reflects the light beam so that it is incident upon a polarization beam splitter 60 in the block 25.

Referring to FIGS. 2 and 5, a pump beam 61 passes through the beam splitter 60 in the block 25 into the block 26. The pump beam 61 then propagates to a mirror 66. The pump beam 61 next reflects from the mirror 66 to a mirror 70 in block 27. The pump beam 61 reflects from the mirror 70 into the block 28 as shown in FIG. 2. The pump beam 61 passes through a second quarter waveplate 74 in the block 28 to an NMR cell 76 that is also in the block 28. After passing through the NMR cell 76, the pump beam 61 enters the block 29 and impinges upon a mirror 78 that reflects the pump beam 61 out of the block 29 to be incident upon a photodetector 80.

In the block 25 a second portion of the source beam, which is designated as the detection beam 83, reflects from the beam splitter 60. The detection beam 83 propagates through the block 25 into the block 28 where the detection beam 83 passes through the NMR cell 76 to a polarizer 84. Thus it can be seen from FIG. 2 that the pump beam and the detection beam 83 follow perpendicular paths through the NMR cell 76. After passing through the polarizer 84 the detection beam is incident upon a photodetector 86.

The overall size of the optics assembly represented by the numbered blocks 18-29 preferably is about 4×4×6 millimeters. This does not include the adjacent substrate (not shown) upon which are mounted the VCSEL laser source 38, the two photodiode a detectors 80 and 86, and the signal processing electronics (not shown). The optics assembly 10 preferably has the following features:

(1) The light beam crosses over from the first section 14 to the second section 16 at only one point between blocks 21 and 24.
(2) The first section 14 contains a folded path layout allowing a maximum distance for the lateral expansion of the diverging laser beam before collimation.
(3) The second section 16 has a number of functions that include beam collimation, beam splitting, beam propagation through the cell 25 in two orthogonal directions, and beam delivery to the two photodetectors 80 and 82.

A key to the operation of the optics assembly 10 is the placement and orientation of the polarizing optics 42, 60 and 84. These polarizing optics components 42, 60 and 84 are needed to provide four suitable operating conditions for the NMR cell 76. These four conditions are:

(1) Circular polarization of the pump beam 61 traveling from block 27 through the NMR cell 76 to the photodetector 80;
(2) Linear polarization of the detection beam 83 traveling from block 25 through the NMR cell 76 to photodetector 86; and
(3) Variable split ratio between the pump beam 61 and the detection beam 83 powers for optimum operation of the NMR cell 76.
(4) Interrogation of the detection beam at photodetector 86 with the variable polarization angle polarizer 84 for optimum operation of the NMR cell 76.

The first quarter waveplate 40 generates circularly polarized light when its polarization axes are oriented at 45° to the linearly polarized output of the VCSEL source 38. Circularly polarized light is incident upon the first polarizer 42 from the first quarter waveplate 40. The polarizer angle is adjustable to control the split ratio at the polarization beamsplitter 60 downstream at block 25. The power transmitted through the polarizer 42 is independent of the polarizer angle because the incident light is circularly polarized.

Elliptically polarized light that has traveled from the first polarizer 42 with four reflections from turning mirrors 36, 46, 50 and 56 in blocks 18, 20, 21, and 24, respectively, is incident upon the polarization beamsplitter 60. The S state component of the incident light is reflected by the beamsplitter 60 to the NMR cell 76 out to the photodetector 86 and the P state component is transmitted by the beamsplitter 60 to turning mirrors 66 and 70 in the blocks 26 and 27, respectively onto to the second quarter waveplate 74.

The second quarter waveplate 74 converts the linearly polarized light incident on it to circularly polarized light that pumps the NMR cell 76. The polarization of the incident light is parallel to the plane of the paper, and the axes of the second quarter waveplate 74 are oriented at 45° to this direction.

The second polarizer 84 with an adjustable angle is used for the detection beam 83.

The alkali-noble gas cell for the NMR gyro 76 has an approximate volume of one cubic millimeter. It will be within a magnetically shielded volume of the order of one cubic centimeter along with the VCSEL laser source 38, two optical detectors 80 and 86, the signal processing electronics, and the optics assembly 10.

The optics assembly 10 preferably is designed in such a way that the VCSEL laser source 38 and the two photodetectors 80 and 86 are on a common substrate (not shown) along with all or most the signal processing electronics (not shown). The path from the VCSEL source 38 to the NMR cell 76 is maximized in length within the constraints imposed by the overall small size of the assembly to enable the generation of a collimated light beam with an approximate diameter of one millimeter that can fill the volume of the NMR cell 76.

Light Polarization Analysis

Referring to FIGS. 1-5, let the top view be in the x-z plane and right and left side views of FIGS. 2 and 4, respectively, be in the x-y plane. The front and back views of FIGS. 3 and 5 are in the y-z plane. The blocks 18, 20, 21, and 24 contain four turning mirrors 36, 46, 50 and 56, respectively, between the first polarizer 42 and the beamsplitter 60. Table 1 is a list showing the plane of incidence, propagation vector direction, S state polarization vector direction, and P state polarization vector direction for light incident on each turning mirror 36, 46, 50 and 56 and the beamsplitter 60. The S state polarization vector for light incident on each turning mirror 36, 46, 50 and 56 and the beamsplitter 60 is normal to the plane of incidence and the propagation direction whereas the P state polarization vector is in the plane of incidence and normal to the propagation direction.

TABLE 1

MIRROR AND BEAMSPLITTER PARAMETERS

| Location | Plane of Incidence | Propagation Direction | S polarization Direction | P polarization Direction |
|---|---|---|---|---|
| Mirror 36 at block 18 | x-y | x | z | y |
| Mirror 46 at block 20 | x-y | y | z | x |
| Mirror 50 at block 21 | x-z | x | y | z |
| Mirror 56 at block 24 | y-z | z | x | y |
| Beamsplitter 60 at block 25 | x-y | y | z | x |

Assume that only S polarized light polarized along z is incident on mirror 36 and trace the beam polarization vector direction as the beam propagates. Table 2 shows the sequence for light incident on each of the turning mirrors 36, 46, 50, 56 and the beamsplitter 60.

TABLE 2

S POLARIZATION VECTOR SEQUENCE

| Location | Polarization Vector Direction | S or P Polarization |
|---|---|---|
| Mirror 36 at block 18 | z | S |
| Mirror 46 at block 20 | z | S |
| Mirror 50 at block 21 | z | P |
| Mirror 56 at block 24 | x | S |
| Beamsplitter 60 at block 24 | x | P |

Now assume that only P polarized light polarized along y is incident on mirror 36. Table shows the sequence in this case.

TABLE 3

P POLARIZATION VECTOR SEQUENCE

| Location | Polarization Vector Direction | S or P Polarization |
|---|---|---|
| Mirror 36 at block 18 | y | P |
| Mirror 46 at block 20 | x | P |
| Mirror 50 at block 21 | y | S |
| Mirror 56 at block 24 | y | P |
| Beamsplitter 60 at block 24 | z | S |

Table 2 shows that linear S polarized light launched toward mirror 36 becomes linear P-polarized light incident on the polarization beamsplitter 60 which transmits all of this light into the path toward photodetector 80. Table 3 shows that linear P polarized light ends up as linear S polarized light incident on the polarization beamsplitter 60, which reflects all of this light toward photodetector 86. Let the first polarizer 42 have an angle of $\theta=0°$ for S polarized light oriented along the z-axis and an angle of 90° for P polarized light along the y-axis. The electric field components from the first polarizer 42 are $$E_S = E_0 \cos\theta \text{ and } E_P = E_0 \sin\theta. \quad (1)$$

Both $E_s$ and $E_p$ propagate to the beamsplitter 60 as linearly polarized components. With no mirror loss, the electric field components $E_s$ and $E_p$ end up at the beamsplitter 60 as $$E_S = E_0 \cos\theta \exp(i\vartheta_P) \text{ and } E_P = E_0 \sin\theta \exp(i\vartheta_S). \quad (2)$$

Notice the flip in S and P that was discussed above. The phases $\phi_P$ and $\phi_S$ are produced by the reflections from the four turning mirrors 36, 46, 50, 56. The phase difference $\phi_P - \phi_S$ is the net retardance upon reflection from the four mirrors 36, 46, 50, 56. For the general case of $\theta$ between zero and 180° as well as $\phi_P - \phi_S$ not being zero or a multiple of 180°, the light incident on the beamsplitter 60 has elliptical polarization.

The intensity ratio of P polarized transmitted light over S polarized reflected light from the polarization beam splitter 60 is $$\frac{I_P}{I_S} = \frac{|E_P|^2}{|E_S|^2} = \tan^2\theta. \quad (3)$$

This ratio is not a function of the mirror retardance of any of the turning mirrors 36, 46, 50, 56. For a chain of turning mirrors 36, 46, 50, 56 with arbitrary angles of incidence in three dimensions, Equation (3) does not hold. This behavior exists only for a chain of turning mirrors in which the planes of incidence of nearest neighbor mirrors are either parallel or normal to one another.

Not discussed so far are the in-plane turning mirrors 66, 70 and 78 in blocks 26, 27, and 29, respectively. The light incident on the mirrors 66 and 70 and 78 is always P polarized normal to the z-axis, and the light incident on the mirror 78 can have any polarization because the power received by the photodetector 80 is independent of polarization.

Components

Miniature waveplates, polarizers, beamsplitters, turning mirrors, and lenses are commercially available for the assembly shown in FIGS. 1-5. For example, polarizers made of Polarcor and waveplates made of thin quartz plates are available in thicknesses of 0.1 to 0.5 mm and diameters of 1.0 mm or less.

The blocks shown in FIGS. 1-5 are used as figurative devices to describe the dimensions of the optics cell and the general layout. There are seven turning mirrors and one beamsplitter occupying eight blocks locations. A modular construction method can be used in which blocks containing the mirrors are placed next to one another and attached. Thin reinforcing plates (not shown) can be attached to the surfaces represented by side views left and right to make the assembly more rigid.

The NMR cell 76 in block 28 has to be secured to the optics assembly 10 and held at an elevated temperature. A thin reinforcing plate on the right side view can be made of a rigid material with high thermal conductivity that can be used as a main point of attachment for the NMR cell 76 as well as a thermal pathway for heating.

What is claimed is:

1. An optics cell for a miniature nuclear magnetic resonance (NMR) gyroscope, comprising:
   an optical signal source arranged to provide an optical signal;
   a beamsplitter arranged to split the optical signal into a pump beam that passes through the beamsplitter in a pump beam optical path and a detection beam that is reflected by the beamsplitter in a detection beam optical path;
   a quarter wave plate arranged such that the pump beam is incident thereon;
   a pair of mirrors arranged to direct the pump beam so that the pump beam and the detection beam optical paths intersect in an NMR cell region after the pump beam has propagated through the quarter wave plate;
   a first photodetector arranged to detect the pump beam after the pump beam has exited the NMR cell region;
   a detector polarizer arranged such that the detection beam is incident thereon after the detection beam has exited the NMR cell region; and
   a second photodetector arranged to detect the detection beam after it propagates through the detector polarizer.

2. The optics cell of claim 1, wherein the beamsplitter is a polarizing beamsplitter, further comprising a source quarter wave plate and a source polarizer arranged such that the optical signal passes through the source quarter wave plate and the source polarizer before impinging upon the polarizing beamsplitter.

3. The optics cell of claim 2 wherein the source polarizer and the polarizing beamsplitter are arranged such that the pump beam passing through the NMR cell region is circularly polarized and the detection beam passing through the NMR cell is linearly polarized.

4. The optics cell of claim 3 wherein the polarizing beamsplitter is formed to have a variable split ratio between the pump beam and the detection beam and wherein the source polarizer and the detector polarizer have adjustable polarizer angles.

5. The optics cell of claim 4, further comprising a collimating lens arranged to provide a collimated optical signal to the polarizing beamsplitter.

6. A method for forming an optics cell for a miniature nuclear magnetic resonance (NMR) gyroscope, comprising the steps of:
arranging an optical signal source to provide an optical signal;
arranging a beamsplitter to split the optical signal into a pump beam that passes through the beamsplitter in a pump beam optical path and a detection beam that is reflected by the beamsplitter in a detection beam optical path;
arranging a quarter wave plate such that the pump beam is incident thereon;
arranging a pair of mirrors arranged to direct the pump beam so that the pump beam and the detection beam optical paths intersect in an NMR cell region after the pump beam has propagated through the quarter wave plate;
arranging a first photodetector to detect the pump beam after the pump beam has exited the NMR cell region;
arranging a detector polarizer such that the detection beam is incident thereon after the detection beam has exited the NMR cell region; and
arranging a second photodetector to detect the detection beam after it propagates through the detector polarizer.

7. The method of claim 6 further comprising the steps of:
forming the beamsplitter as a polarizing beamsplitter; and
arranging a source quarter wave plate and a source polarizer arranged such that the optical signal passes through the source quarter wave plate and the source polarizer before impinging upon the polarizing beamsplitter.

8. The method of claim 7 further comprising the steps of arranging the source polarizer and the polarizing beamsplitter such that the pump beam passing through the NMR cell region is circularly polarized and the detection beam passing through the NMR cell is linearly polarized.

9. The method of claim 8 further comprising the steps of:
forming the polarizing beamsplitter to have a variable split ratio between the pump beam and the detection beam; and
forming the source polarizer and the detector polarizer to have adjustable polarizer angles.

10. The method of claim 9, further comprising the step of arranging a collimating lens to provide a collimated optical signal to the polarizing beamsplitter.

* * * * *